United States Patent [19]

Horninger

[11] 4,037,089
[45] July 19, 1977

[54] INTEGRATED PROGRAMMABLE LOGIC ARRAY

[75] Inventor: Karlheinrich Horninger, Eglharting, Germany

[73] Assignee: Siemens Aktiengesellschaft, Berlin & Munich, Germany

[21] Appl. No.: 633,959

[22] Filed: Nov. 20, 1975

[30] Foreign Application Priority Data

Nov. 21, 1974 Germany .......................... 2455178

[51] Int. Cl.² .................... G11C 15/00; H03K 19/08
[52] U.S. Cl. .................................. 235/152; 307/207; 340/166 R; 340/173 AM; 364/900
[58] Field of Search .................. 235/152; 340/172.5, 340/173 FF, 173 AM, 166 R; 307/207, 238

[56] References Cited

U.S. PATENT DOCUMENTS

| 3,566,153 | 2/1971 | Spencer, Jr. ............... 340/166 R X |
| 3,656,010 | 4/1972 | Huyben et al. ............ 340/173 FF X |
| 3,761,902 | 9/1973 | Weinberger ................. 340/173 FF |
| 3,816,725 | 6/1974 | Greer ............................... 235/152 |
| 3,924,243 | 12/1975 | Vermeulen ............... 340/173 AM X |

OTHER PUBLICATIONS

Kent Andres, "Mos Programmable Logic Arrays," A Texas Instruments Application Report, No. CA-158, Oct. 1970, pp. 1-4.

J. E. Elliott et al., "Array Logic Processing," IBM Technical Disclosure Bulletin, vol. 16, No. 2, July 1973, pp. 586-587.

Primary Examiner—Jerry Smith
Attorney, Agent, or Firm—Hill, Gross, Simpson, Van Santen, Steadman, Chiara & Simpson

[57] ABSTRACT

An integrated circuit comprising a programmable logic array includes an AND-gate array and an OR-gate array connected thereto with column lines of the AND-gate array being shared in common with column lines of the OR-gate array. The AND-gate array and the OR-gate array are both operated dynamically, and a dynamically operated shift register is interconnected between an output of the OR-gate array and an input of the AND-gate array, to supply a feedback signal to the latter to realize sequential logic functions.

19 Claims, 3 Drawing Figures

INTEGRATED PROGRAMMABLE LOGIC ARRAY

BACKGROUND

1. Field of the Invention

The present invention relates to programmable logic arrays and more particularly to such arrays having a feedback circuit for connecting an output of the array to an input of the array, to provide sequential logic.

2. The Prior Art

Programmable logic arrays have been described in "MOS/LSI Design and Application," by W. Carr & J. Mize, published by McGraw-Hill Book Co., New York, 1972. On pages 229–258 a logic arrangement is described consisting of an AND-gate matrix, an OR-gate matrix, and associated feedback and output circuits. The provision of a feedback loop makes it possible for the output of the logic array to depend not only on the instantaneous inputs, but also on the inputs to the logic array during a previous time interval. The AND-gate matrix and the OR-gate matrix consist of fixed word storage devices, with load transistors connected as resistances, by which the capacitances at the outputs of the gates of the fixed word storage devices are charged. This arrangement places a relatively low limit on the operating speed of the array, and also limits the packing density which can be obtained.

It is, therefore, desirable to provide a programmable logic array which is capable of faster operation, and in which a greater packing density can be achieved.

BRIEF DESCRIPTION OF THE PRESENT INVENTION

It is a principle object of the present invention to provide a programmable logic array in which a relatively high speed operation is possible.

Another object of the present invention is to provide a programmable logic array in which a greater packing density may be achieved.

These and other objects and advantages of the present invention will become manifest upon an inspection of the following description in the accompanying drawings.

In one embodiment of the present invention there is provided an integrated circuit having a plurality of AND-gates and a plurality of OR-gates, said AND-gates and OR-gates sharing column lines of the array, whereby the OR-gates receive, as inputs, the outputs of the AND-gates, and a feedback circuit interconnected between an output of at least one OR-gate and an input of at least one AND-gate, the AND-gate array, the OR-gate array, and the feedback circuit all comprising dynamically operated storage elements.

BRIEF DESCRIPTION OF THE DRAWINGS

Reference will now be made to the accompanying drawings in which.

DESCRIPTION OF THE PRIOR ART AND THE PRESENT EMBODIMENT

Figure 1:
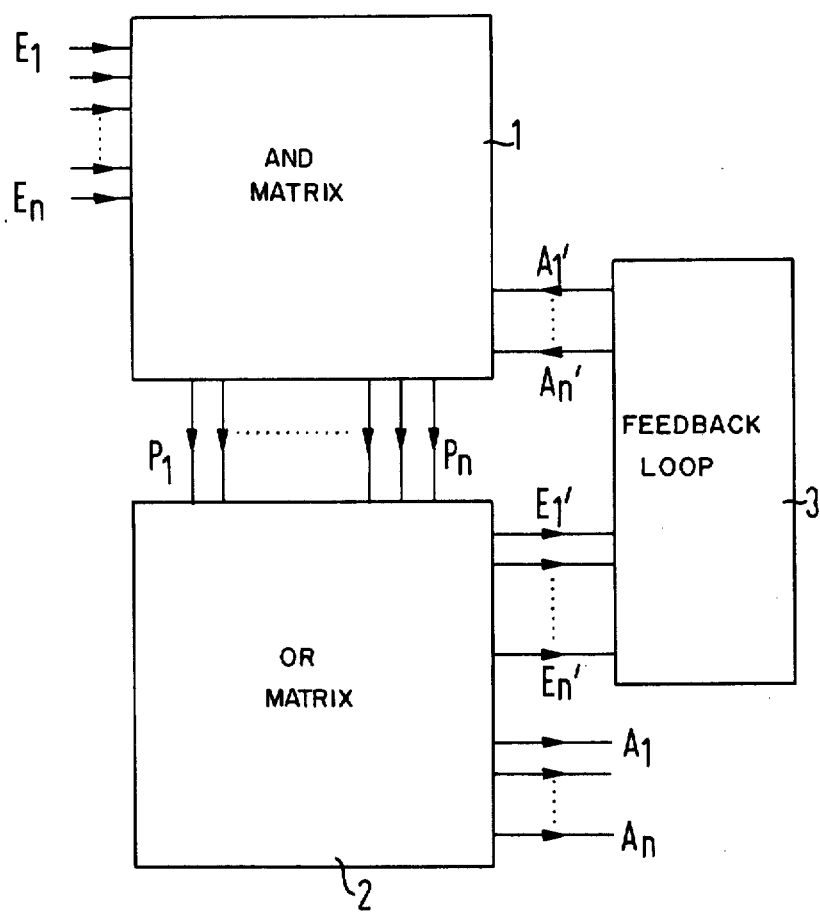
FIG. 1 is a functional block diagram of an arrangement known in the prior art.

FIG. 1 illustrates, in block diagram for, a known arrangement for a programmable logic array, incorporating an AND-gate matrix, 1 and OR-gate matrix 2, and a feedback circuit 3, interconnected between outputs of the OR-gate matrix 2 and inputs of the AND-gate matrix 1.

A plurality of inputs $E_1-E_n$ are connected to the AND-gate matrix 1, and a plurality of outputs are made available over lines $P_1-P_n$, which are connected as inputs of the OR-gate matrix 2. The AND-gate matrix 1 incorporates a plurality of AND-gates, which are interconnected in such a way as to form output signals on various ones of the output lines $P_1-P_n$, in accordance with various combinations of input signals simultaneously applied to the lines $E_1-E_n$.

Two sets of outputs are provided from the OR-gate matrix 2. Output lines $A_1-A_n$ are outputs which are made available to external apparatus, while outputs on lines $E_1'-E_n'$ are connected as inputs of the feedback circuit 3. The feedback circuit 3 contains static flip-flops which temporarily store the signals produced on the lines $E_1'-E_n'$, and produce a plurality of outputs on a set of lines $A_1'$ through $A_n'$ so that subsequent signals supplied to the AND-gate matrix 1 are logically linked with the flip-flop signals. In this way it is possible to realize sequential logic functions.

In the prior art the matrixes 1 and 2 consist of fixed word storage devices, and the feedback circuit 3 consists of static flip-flops. This arrangement has proved to be relatively slow, as the capacitances of the outputs of the individual gates of all three units 1–3 must be charged by way of load transistors connected as resistances. The packing density is also limited by the size of the compounds making up the units 1–3.

Figure 2:
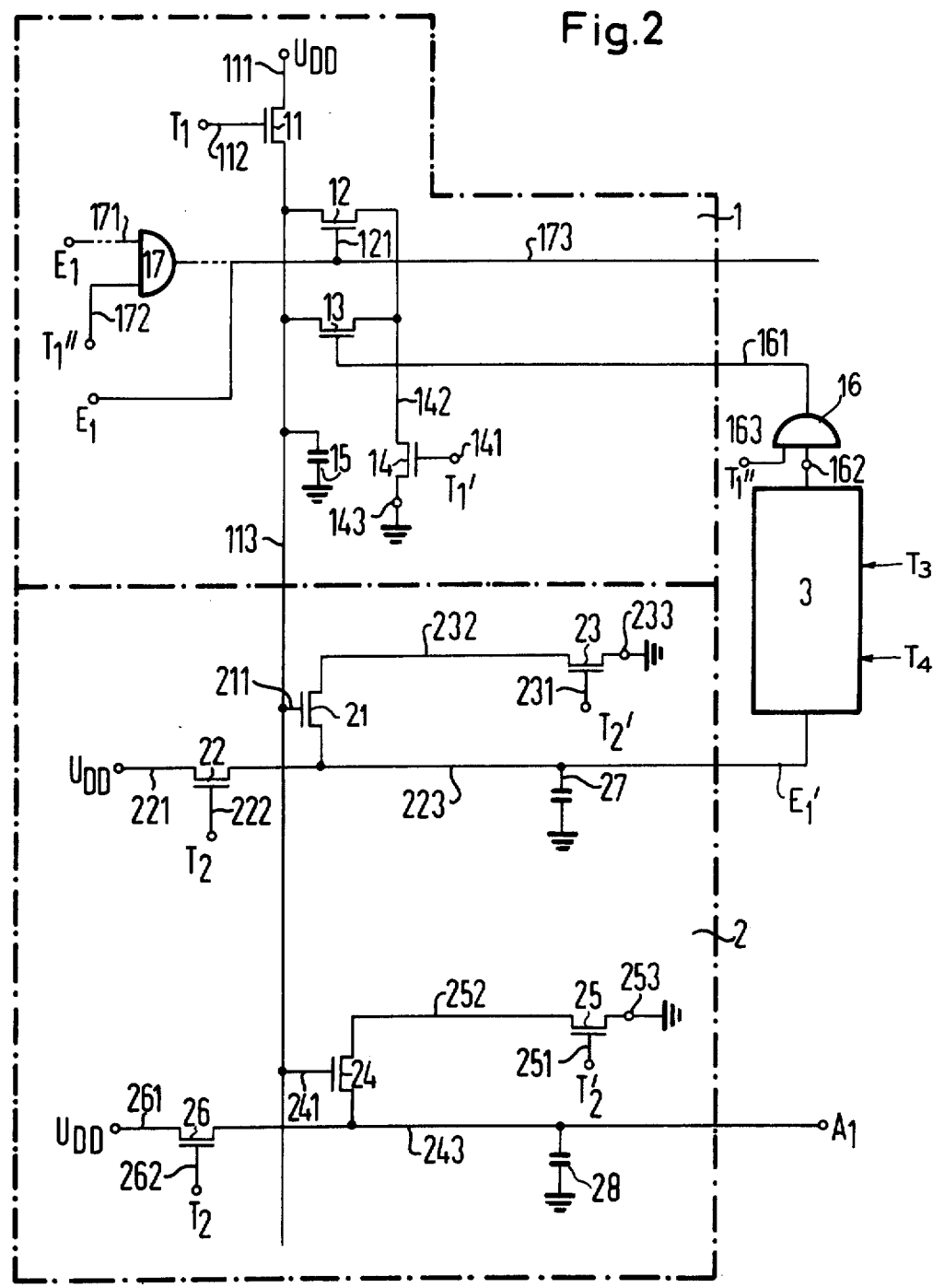
FIG. 2 is a schematic circuit diagram, partly in functional block diagram form, diagramatically illustrating the structure of an integrated circuit incorporating an illustrative embodiment of the present invention.

A schematic circuit diagram, partly in functional block diagram form, of an integrated circuit incorporating an illustrative embodiment of the present invention is shown in FIG. 2 It comprises a plurality of dynamic storage elements which are interconnected in a manner to form an AND-gate matrix 1, an OR-gate matrix 2 and a feedback circuit 3. The AND-gate matrix 1 and the OR-gate matrix 2 share a plurality of column lines in common, as described in detail hereinafter.

The dynamic storage elements used for the matrixes 1 and 2 and for the feedback circuit 3, dissipate only a small amount of power, much less than is required for programmed logic arrays of the prior art. There is no transverse current flow from one power supply terminal to another with the dynamic storage elements, except to charge very small capacitors. The use of a one-stage dynamic shift register for the feedback circuit 3, in place of the static flip-flops previously used, also considerably reduces the space requirement, in comparison with previously known devices.

For simplicity only a single input $E_1$ has been illustrated for the AND-gate matrix 1; only two output lines are shown for the OR-gate matrix 2; and only one column line 113 is shown which is common to the AND-gate matrix and the OR-gate matrix.

The input $E_1$ is connected directly to a row line 173 of the AND-gate matrix 1. A transistor 12 has its gate connected to the line 173 over a line 121, and serves to connect a column line 113 with a line 142.

The column line 113 is connected through a transistor 11 and a line 111 to a source of potential $U_{DD}$. The gate of the transistor 11 is connected by a line 112 to a source of timing pulses $T_1$ which pulses occur at a specific time during each cycle of operation of the apparatus. The line 142 is connected through a transistor 14 to a reference potential (ground) at a terminal 143. The gate of the transistor 14 is connected to a source of timing pulses $T_1'$, which pulses occur at a specific time during each cycle of operation of the apparatus.

In an alternative form of the present invention, the transistor 14 is omitted and the line 142 is connected directly to the terminal 143, and an AND gate 17 is interposed between the $E_1$ input and the row line 173 of the AND-gate matrix 1. In this case, the input $E_1$ is connected to one input of the gate 17, and a source of timing pulses $T_1''$ is applied to the other input over a line 172. The timing pulses $T_1''$ are produced at specific times during each cycle of operation of the apparatus.

A storage capacitor 15 is connected between the column line 113 and a source of reference potential. No special construction is required for the storage capacitor 15, and it is preferred that the capacitor 15 is formed only of the line capacitances and the gate capacitances of transistors of the OR-gate matrix 2, which have their gates connected with the line 113.

When a pulse $T_1$ is applied to the transistor 11 over the line 112, the transistor 11 becomes conductive and charges the capacitor 15 to the potential $V_{DD}$. To prevent current from flowing from $V_{DD}$ to reference potential during the time that the clock pulse $T_1$ is present, the transistor 14 is cut off or blocked at this time by the pulse $T_1'$ which is simultaneously applied to the gate of the transistor 14.

If the transistor 14 is omitted, and the gate 17 is used instead, the pulse $T_1''$ is applied to the line 172 to cause the gate 17 to generate an output which cuts off the transistor 12, during the time that the transistor 11 is conductive. Thus, no current can flow directly through transistor 11 to reference potential, because either the transistor 12 or the transistor 14 is cut off when the transistor 11 is conductive.

In the OR-gate matrix 2, the gate of a transistor 24 is connected to the column line 113 by a line 241. The transistor 24 is connected between a row line 243 of the OR-gate matrix 2 and a line 252, which is connected through a transistor 25 to a source of reference potential at a terminal 253. The gate of the transistor 25 is connected over a line 251 to a source of timing pulses $T_2'$. A storage capacitor 28 is connected between the line 243 and a source of reference potential. It has no special construction, but is formed of the natural line capacitance of the line 243.

A transistor 26 connects the line 243 to a source of potential $V_{DD}$ through a line 261. The gate of the transistor 26 is connected to a source of timing pulses $T_2$ by a line 262.

Figure 3:
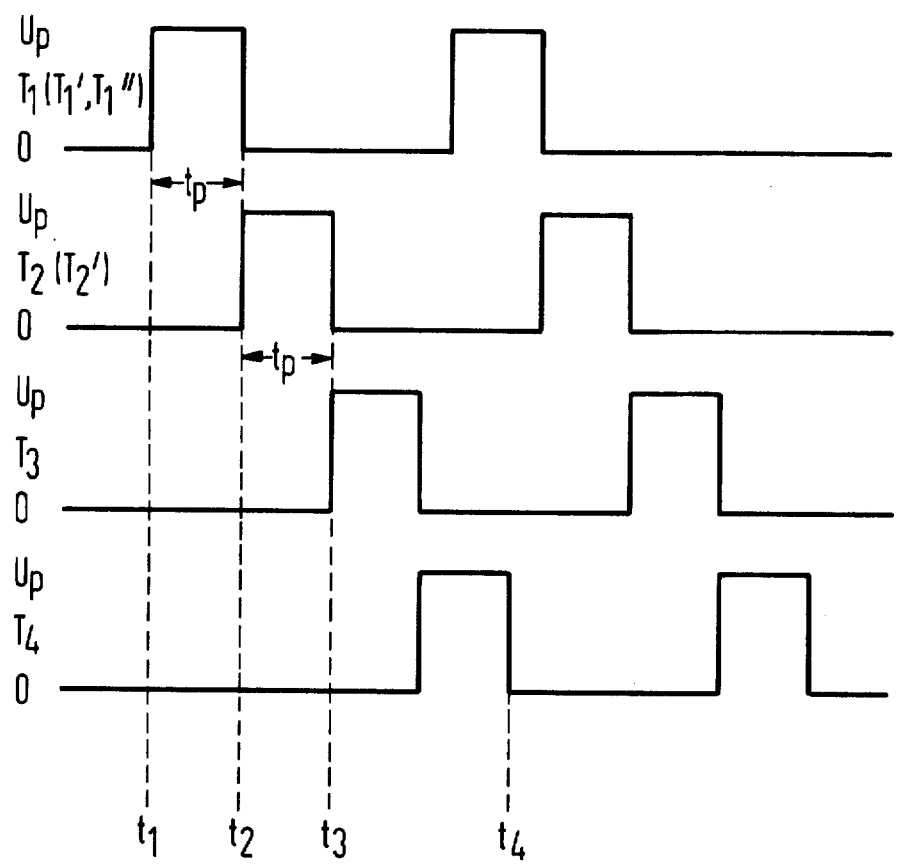
FIG. 3 is a timing diagram illustrating the relative timing of timing pulses employed during operation of the apparatus of FIG. 2.

In operation, the capacitor 15 is charged at time $t_1$ (FIG. 3) to the potential $V_{DD}$, by operation of the transistor 11 by the pulse $T_1$, the pulse $T_1$ terminates at time $t_2$ and the transistor 11 is blocked. At time $t_2$, the pulse $T_1'$ occurs and the transistor 14 becomes conductive. If the signal on the input $E_1$ is such as to render the transistor 12 conductive, the capacitor 15 is immediately discharged through the transistors 12 and 14. On the other hand, if the signal on the line $E_1$ does not render the transistor 12 conductive, the capacitor 15 is permitted to retain its charge.

In the alternative embodiment, in which the transistor 14 is omitted, the capacitor 15 is discharged or not, depending on the polarity of the output of the gate 17, which depends, during the occurrence of the pulse $T_1''$, on the polarity applied to the input line $E_1$. The pulse $T_1''$ causes the gate 17 to provide an output to the gate of the transistor 12 beginning at time $t_2$ for discharging the capacitor 15. In the OR-gate matrix 2, the capacitor 28 is charged to the potential $V_{DD}$ through the transistor 26, at time $t_2$, when it is rendered conductive by the pulse $T_2$. At this time the transistor 25 is blocked, so that there is no path for current to flow from the $V_{DD}$ potential to the terminal 253 which is maintained at reference potential. Subsequently, at time $t_3$, the transistor 25 is rendered conductive by the pulse $T_2'$, which effectively connects the line 252 to the reference potential terminal 253. If the capacitor 15 has retained its charge, the transistor 24 is rendered conductive thereby, and functions to discharge the capacitor 28 through the transistor 25. If, on the other hand, the capacitor 15 has previously been discharged through the transistor 12, the transistor 24 remains blocked, and the capacitor 28 is permitted to retain its charge. The output at terminal $A_1$ furnishes the correct output from the OR matrix 2 from shortly after $t_3$ until time $t_2$ to the next cycle.

FIG. 2 illustrates a second transistor 21 having its gate connected with the column line 113. It is associated with a row line 223, which is connected to the input of the feedback circuit 3. The transistor 21 is connected in the same manner which has been described in connection with the transistor 24, and functions in the same manner. A capacitor 27, consisting of the line capacitance of the line 223, is connected between the line 223 and ground, and this capacitance is charged at time $t_2$ to the level of $V_{DD}$ through a line 221 and a transistor 22, when the pulse $T_2$ is applied to the gate of the transistor 22 over a line 222. Subsequently, at time $t_2$, the capacitor 27 is discharged, by the transistor 21, providing the capacitor 15 has not been previously discharged, over a line 232 and through transistor 23 to a source of reference potential at terminal 233, when a pulse $T_2'$ is applied to the gate of the transistor 23 over line 231. If the capacitor 15 has been discharged, the transistor 21 is blocked and the capacitor 27 retains its charge.

The row line 223 furnishes the output $E_1'$ of the OR-gate matrix 2, which is supplied to the input of the feedback circuit 3. The feedback circuit 3 constitutes a one-stage dynamic shift register, so a signal appearing on the line 223 during one cycle is caused to appear on the output terminal 162 of the feedback circuit 3 during the next cycle. Pulses $T_3$ and $T_4$, applied to the shift register between time $t_3$ and $t_4$ cause the shift register to operate to produce its output at the desired time.

The gate 16 has one input connected to the terminal 162 and another input connected to a control terminal 163, which receives pulses $T_1''$, at time $t_2$. The output of the gate 16 is connected by a line 161 to the gate of a transistor 13, which is connected between the lines 113 and 142. The transistor 13 operates in the same manner described above in connection with the transistor 12, to selectively discharge the capacitor 15 when the transistor is rendered conductive by a signal of the appropriate polarity on the line 161.

The dynamic shift register 3 may be a pulsed master-slave flip-flop such as a JK flip-flop or a D-type flip-flop.

The transistors 12 and 13 are connected in parallel, and as they are operated at the same time, either is effective to discharge the capacitor 15. In this manner the output of the feedback shift register 3 is a logic-linked with the terminal $E_1$, so that the output terminal $A_1$ is responsive to the data received during one cycle over the terminal $E_1$ and data received during the previous cycle over the line $E_1'$.

The circuit details of the one-stage dynamic shift register may be of the type described on pages 147-169 of the aforementioned book by Carr and Mize.

Preferably, the logic array of FIG. 2 is constructed with complementary MOS transistors, in which the transistor 11 is in an n-channel transistor and the transistor 14 is a p-channel transistor. When this construction is employed only a single timing pulse is necessary instead of two timing pulses $T_1$ and $T_1'$, since only one of the complementary transistors 11 and 14 becomes conductive, depending on the polarity of the pulse. The transistors 22 and 23 are also complementary, as are the transistors 25 and 26, so that only one source of pulses is required to furnish the pulses $T_2$ and $T_2'$.

When complementary transistors are not employed, a single source of pulses is connected to an inverter to supply the $T_1$ pulses directly, and the $T_1'$ and $T_1''$ pulses through the inverter, on successive half cycles of the source. A similar arrangement may be used to provide the $T_2$ and $T_2'$ pulses. When complementary transistors are employed, the inverters are, of course, unnecessary.

The arry of the present invention is programmed preferably during the manufacturing process, by placing switching transistors at desired places in the AND-gate matrix and in the OR-gate matrix. Each switching transistor is placed at the junction of a column line and a row line. In the AND-gate matrix 1 the function of the several switching transistors connected with a given column line is to produce a logical AND function on the column line, in response to signals appearing on the row lines with which such switching transistors are associated, If an input signal is regarded as true which blocks conduction of the switching transistors 12 and 13, the capacitor 15 is permitted to retain its charge if, and only if, all of the inputs to the gates of the switching transistors associated with this column line are true. Accordingly, the presence of a charge on the capacitor 15 indicates a logical AND function.

In the OR-gate matrix 2, switching transistors are also provided at intersections between row lines and column lines. A plurality of switching transistors associated with a given row line performs a logical OR function, and the capacitor 27 of such row line becomes discharged if any of the column lines connected with the gates of the switching transistors associated with such row line provide signal for discharging the capacitor 27, i.e., the capacitor 15 on at least one column line remains charged.

The pulses which are required to cause the apparatus to operate in the correct sequence are generated by conventional pulse generating apparatus which need not be described in detail. Such apparatus is not critical, as long as the pulses occur at different times so that the transistors interconnected in series between the source of potential $U_{DD}$ and reference potential are never simultaneously conductive.

It will be appreciated by those skilled in the art that the apparatus of the present invention permits substantially faster operation than the apparatus known in the prior art. In addition, because of its compact construction, it can attain a much greater packing density so that programmable logic arrays are possible which have a large number of input and output terminals, particularly when an MOS technology is employed in their fabrication Various modifications and additions will become apparent to those skilled in the art in the apparatus of the present invention, without departing from the essential features of novelty thereof, which are intended to be defined and secured by the appended claims.

What is claimed is:

1. An integrated circuit programmable logic array, comprising an AND matrix with row lines and column lines, a plurality of inputs connected to the row lines of the AND matrix and a plurality of outputs connected to column lines of the AND matrix: an OR matrix with row lines and column lines, said column lines being connected to receive inputs from the outputs of said AND matrix and a plurality of outputs connected with row lines of the OR matrix, said AND matrix and said OR matrix each having switching transistors interconnecting said row lines and column lines in accordance with the programming of the matrixes; a column transistor for each column line of said AND matrix, means for connecting a first source of electrical potential to each of said column lines of said AND matrix through its respective column transitor when said column transistor is rendered conductive, said switching transistors of said AND matrix being connected to said column lines and operative to individually connect a second source of electrical potential to said column lines when said AND matrix transistors are rendered conductive by a signal applied to their row lines, a storage capacitor connected with each of said column lines, said switching transistors of said OR matrix being connected to the row lines of said OR matrix and operative to individually connect said row lines to a third source of electrical potential when said OR gate switching transistors are rendered conductive by signals on their respective column lines, said OR matrix including a row transistor for each row line of said OR matrix, means for connecting a fourth source of electrical potential to each of said row lines of said OR matrix through its respective now transistor when said row transistor is rendered conductive, a storage capacitor connected with each of the rows of said OR matrix; a plurality of control transistors, each interconnected between a plurality of said switching transistors and a source of electrical potential for selectively rendering said switching transistors nonconductive; and a delaying feedback circuit connected between an output of said OR matrix and input of said AND matrix, whereby data from an output of said OR matrix is logically linked with data subsequently present on the inputs of said AND matrix, both of said matrixes and said feedback circuit being constructed of dynamically operated storage elements, said feedback circuit including feedback switching transistor in said OR matrix for interconnecting a column line with a feedback row line of said OR matrix, said first feedback switching transistor being connected for selectively connecting its respective row with said third source of potential in response to a signal on said column line, said feedback row line of said OR matrix being connected to the input of said feedback circuit, and including a second feedback switching transistor in said AND matrix for interconnecting a column line with the output of said feedback circuit, said second feedback switching transistor being connected for selectively connecting its respective column line with said second source of electrical potential in response to a signal from said feedback circuit.

2. Apparatus according to claim 1, including a gate interconnected between said AND matrix and the output of said feedback circuit, for selectively isolating said AND matrix from said feedback circuit.

3. Apparatus according to claim 1, wherein said feedback circuit comprises a dynamically operated JK master-slave flip-flop.

4. Apparatus according to claim 1, wherein said feedback circuit comprises a dynamically operated D-type master-slave flip-flop.

5. Apparatus according to claim 1, wherein said feedback circuit comprises a one-stage dynamic shift register.

6. Apparatus according to claim 1, including a source of pulses occurring to spaced times for intermittently operating said control transistors.

7. Apparatus, according to claim 1, wherein one terminal of each of a plurality of switching transistors of said AND matrix is connected in common and one of said control transistors is interconnected between said second source of potential and said common connection, whereby no current can flow through said switching transistors unless said one control transistor is conducting.

8. Apparatus, according to claim 1, wherein one terminal of each of a plurality of switching transistors of said OR matrix is connected in common and one of said control transistors is interconnected between said second source of potential and said common connection, whereby no current can flow through said switching transistors unless said one control transistor is conducting.

9. Apparatus according to claim 1, including a first source of clock pulses connected to said column transistors for causing said column transistors to charge the storage capacitors connected with said column lines and a second source of clock pulses connected to said row transistors for causing said row transistors to charge the storage capacitors connected with said row lines.

10. Apparatus, according to claim 9, wherein the clock pulses of said second source occur after the clock pulses of said first source, and means for selectively rendering the control transistors of said AND matrix conductive for selectively discharging the storage capacitors connected with said column lines after they are charged by the clock pulses of said first source.

11. Apparatus, according to claim 20, including means for selectively rendering the control transistors of said OR matrix conductive for selectively discharging the storage capacitors connected with said row lines after they are charged by the clock pulses of said second source.

12. An integrated circuit programmable logic array, comprising an AND matrix with row lines and column lines, a plurality of inputs connected to the rowlines of the AND matrix and a plurality of outputs connected to column lines of the AND matrix; an OR matrix with row lines and column lines, said column lines being connected to receive inputs from the outputs of said AND matrix and a plurality of outputs connected with row lines of the OR matrix, said AND matrix and said OR matrix each having switching transistors interconnecting said row lines and column lines in accordance with the programming of the matrixes; a column transistor for each column line of said AND matrix, means for connecting a first source of electrical poential to each of said column lines of said AND matrix through its respecitve column transistor when said column transistor is rendered conductive, said switching transistors of said AND matrix being connected to said column lines and operative to individually connect a second source of electrical potential to said column lines when said AND matrix switching transistors are rendered conductive by a signal applied to their respective row lines, a storage capacitor connected with each of said column lines, said lines, said switching transistors of said OR matrix being connected to the row lines of said OR matrix and operative to individually connect said row lines to a third source of electrical potential when said OR gate switching transistor are rendered conductive by signal on their column lines, and OR matrix including a row transistor for each row line of said OR matrix, means for connecting a fourth source of electrical potential to each of said row lines of said OR matrix through its respective row transistor when said row transistor is rendered conductive, and a storage capacitor connected with each of the rows of said OR matrix; an input gate for each row of said AND matrix, for selectively isolating input signal to said AND matrix from the rows of said matrix, and a delaying feedback circuit connected between an output of said OR matrix and input of said AND matrix, whereby data from an output of said OR matrix is logically linked with data subsequently present on the inputs of said AND matrix, both of said matrixes and said feedback circuit being constructed dynamically operated storage elements, said feedback circuit including a first feedback switching transistor in said OR matrix for interconnecting a column line with a feedback row line of said OR matrix, said first feedback switching transistor being connected for selectively connecting its respective row line with said third source of potential in response to a signal on said column line, said feedback row line of said OR matrix being connected to the input of said feedback circuit, and including a second feedback switching transistor in said AND matrix for interconnecting a column line with the output of said feedback circuit, said second feedback switching transitor being connected for selectively connecting its respective column line with said second source of electrical potential in response to a signal from said feedback circuit.

13. Apparatus, according to claim 12, including a first source of clock pulses connected to said column transistors for causing said column transistors to charge the storage capacitors connected with said column lines and a second source of clock pulses connected to said row transistors for causing said row transistors to charge the storage capacitors connected with said row lines.

14. Apparatus, according to claim 3, wherein the clock pulses of said second source occur after the clock pulses of said first source, and means for selectively disabling said input gates during the clock pulses of said first source, whereby the switching transistors of said AND matrix are rendered non-conductive during the clock pulses of said first source.

15. Apparatus, according to claim 14, including means for selectively rendering the control of said OR matrix conductive for selectively discharging the storage capacitors connected with said row lines after they are charged by the clock pulses of said second source.

16. An integrated circuit programmable logic array, comprising an AND matrix with row lines and column lines, a plurality of inputs connected to the row lines of the AND matrix and a plurality of outputs connected to column lines of the AND matrix; an OR matrix with row lines and column lines, said column lines being connected to receive inputs from the outputs of said AND matrix and a plurality of outputs connected with row lines of the OR matrix, said AND matrix and said OR matrix each having switching transistors interconnecting said row lines and column lines in accordance with the programming of the matrixes; a column transistor for each column line of said AND matrix, means for connecting a first source of electrical potential to each of said column lines of said AND matrix through its respective column transistor when said column transistor is rendered conductive, a storage capacitor connected to each of said column lines, means for charging each of said column line storage capacitors through said column transitors, said switching transistors of said AND matrix being connected to said column lines and operative to individually connect a second source of eletrical potential to said column lines for discharging said column line storage capacitors when said AND matrix switching transistors are rendered conductive by a signal applied to their respective row lines, sai OR matrix including a row transistor for each row line of said OR matrix, means for connecting a fourth source of electrical potential to each of said row lines of said OR matrix through its respective row transitor when said row transistor is rendered conductive, a storage capacitor connected with each of the rows of said OR matrix, means for charging each of said row line storage capacitors through said row transistors, said switching transistors of said OR matrix being connected to the row lines of said OR matrix and operative to individually connect said row lines to a third source of electrical potential for discharging said row line storage capacitors when said OR gate switching transistors are rendered conductive by signal on their respective column lines.

17. Apoaratus according to claim 16, wherein said integrated circuit is constructed in a MOS technique.

18. Apparatus according to claim 16, wherein said column lines are common to said AND matrix and to said OR matrix in said integrated circuit.

19. Apparatus according to claim 16, including a source of pulses occurring at spaced times for intermittently operating said column and row transistors.

* * * * *